(12) United States Patent
Luan (10) Patent No.: US 11,581,232 B2
(45) Date of Patent: Feb. 14, 2023

(54) SEMICONDUCTOR DEVICE WITH A DIELECTRIC BETWEEN PORTIONS

(71) Applicant: STMicroelectronics PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 57 days.

(21) Appl. No.: 16/880,684

(22) Filed: May 21, 2020

(65) Prior Publication Data

US 2020/0381320 A1 Dec. 3, 2020

Related U.S. Application Data

(60) Provisional application No. 62/854,603, filed on May 30, 2019.

(51) Int. Cl.
*H01L 29/786* (2006.01)
*H01L 23/29* (2006.01)
(Continued)

(52) U.S. Cl.
CPC ............ *H01L 23/293* (2013.01); *H01L 21/56* (2013.01); *H01L 21/78* (2013.01);
(Continued)

(58) Field of Classification Search
CPC ....... H01L 23/293; H01L 21/56; H01L 21/78; H01L 23/3178; H01L 23/3192; H01L 24/03; H01L 24/05; H01L 25/0655; H01L 2224/02371; H01L 24/02; H01L 24/13; H01L 25/18; H01L 2224/02377; H01L 2224/0401; H01L 2224/04042; H01L 2224/05548; H01L 2224/13022;
(Continued)

(56) References Cited

U.S. PATENT DOCUMENTS 7,402,515 B2 7/2008 Arana et al.
9,524,959 B1 * 12/2016 Yeh .......................... H01L 24/29
(Continued)

OTHER PUBLICATIONS

Fan et al., "Reliability Challenges and Design Considerations for Wafer-Level Packages," 2008 International Conference on Electronic Packaging Technology & High Density Packaging (ICEPT-HDP 2008), 6 pages.
(Continued)

*Primary Examiner* — Thanh T Nguyen
(74) *Attorney, Agent, or Firm* — Seed IP Law Group LLP (57) ABSTRACT

A semiconductor device having a channel between active sections or portions of the device is disclosed. An elastic material, such as dielectric or a polymer, is deposited into the channel and cured to increase flexibility and thermal expansion properties of the semiconductor device. The elastic material reduces the thermal and mechanical mismatch between the semiconductor device and the substrate to which the semiconductor device is coupled in downstream processing to improve reliability. The semiconductor device may also include a plurality of channels formed transverse with respect to each other. Some of the channels extend all the way through the semiconductor device, while other channels extend only partially through the semiconductor device.

20 Claims, 10 Drawing Sheets

(51) Int. Cl.
*H01L 23/31* (2006.01)
*H01L 21/56* (2006.01)
*H01L 25/065* (2023.01)
*H01L 23/00* (2006.01)
*H01L 21/78* (2006.01)

(52) U.S. Cl.
CPC ...... *H01L 23/3178* (2013.01); *H01L 23/3192* (2013.01); *H01L 24/03* (2013.01); *H01L 24/05* (2013.01); *H01L 25/0655* (2013.01); *H01L 2224/02371* (2013.01)

(58) Field of Classification Search
CPC ..... H01L 2224/13024; H01L 2224/131; H01L 2224/16237; H01L 2224/32225; H01L 2224/48227; H01L 2224/94; H01L 21/561; H01L 21/563; H01L 23/3128; H01L 23/562
See application file for complete search history.

(56) References Cited

U.S. PATENT DOCUMENTS

| | | |
|---|---|---|
| 2003/0143819 A1 | 7/2003 | Hedler et al. |
| 2008/0157340 A1* | 7/2008 | Yang .................. H01L 25/0655 257/691 |
| 2009/0011543 A1 | 1/2009 | Karta et al. |
| 2016/0218082 A1* | 7/2016 | Lee ....................... H01L 23/293 |
| 2019/0295912 A1* | 9/2019 | Yu ....................... H01L 23/5389 |

OTHER PUBLICATIONS

Strothmann et al., "Encapsulated Wafer Level Package Technology (eWLCS)," 2014 Electronic Components & Technology Conference, pp. 931-934.

* cited by examiner

SEMICONDUCTOR DEVICE WITH A DIELECTRIC BETWEEN PORTIONS

BACKGROUND

Technical Field

The present disclosure is directed to a semiconductor device, and more particularly, a semiconductor device having multiple active portions with a channel filled with a polymer between the active sections or portions.

Description of the Related Art

Wafer Level Chip Scale Packages ("WLCSPs") are common in the packaging space because of their small size and efficient assembly process. WLCSPs typically include a single semiconductor die and are coupled to a support substrate. One of the biggest challenges for WLCSPs is the mismatch in the coefficient of thermal expansion ("CTE") between the WLCSP and the support substrate. This mismatch in CTE leads to reliability issues, as thermal cycling during operation can cause the connection between the WLCSP and the substrate to separate. Separation allows contaminants to come into contact with an active area of the WLSCP or the substrate, thus leading to electrical shorting and overall package failure.

More specifically, the substrate typically has a first CTE and the WLCSP typically has a second, different CTE. In many circumstances, the CTE of the substrate is usually greater than that of the WLCSP. The WLCSP is coupled to the substrate, typically with solder. During operation, the resulting combination of the WLCSP and the substrate are subjected to a range of temperatures due to the heat produced by operation. In other words, the WLCSP and substrate under thermal cycles from a first, lower temperature when not in operation to a second, higher temperature during operation before returning to the first, lower temperature when operation ceases. Normally, the WLCSP and substrate are subjected to thousands, if not more, of these on-off cycles and subsequent temperature cycles during a useful life of the WLCSP.

During each of these cycles, the increase in temperature during operation causes expansion of the WLCSP and the substrate. However, because the CTE of each of these devices is different, the substrate and the WLCSP will expand different amounts in response to the change in temperature. Over time, this can lead to cracking of the connection between the WLCSP and the substrate, and eventually separation of the WLCSP and the substrate. Once cracked or separated, contaminants, such as water or dirt, for example, can come into contact with electricity flowing through either the WLCSP or the substrate, or both, which will cause an electrical short. An electrical short can lead to complete failure of the WLCSP or the substrate, such as by overheating, fire, explosion, or damage to the integrated circuits or other electrical connections in the WLCSP and the substrate.

Moreover, the difference in CTE between the substrate and the WLCSP creates limitations on the size of the WLCSP, as the above issues are compounded for larger scale WLCSPs. In other words, using a larger WLCSP is likely to lead to issues earlier than with a smaller WLCSP because there is more material that is expanding and a larger, weaker connection between the components. This restriction in size further limits the number of the electrical connections that can be established between the WLCSP and the substrate because there is less space for the electrical connections on the WLCSP. The restriction on the number of electrical connections limits the application of WLCSPs because the limitation on the number of electrical connections limits the functionality associated with the WLCSP. Some applications of semiconductor devices implement larger semiconductor devices and more electrical connections than are currently reliably able to be produced with known WLCSPs.

BRIEF SUMMARY

The present disclosure is directed to a semiconductor device having multiple active portions with a channel extending at least partially through, or all the way through the device between the portions. The channel is preferably filled with an elastic material, such as a polymer or other insulative and resilient buffer material. The elastic material absorbs stress and strain within the semiconductor device due to thermal expansion of the semiconductor device during operation. This includes the stresses and strains that are introduced to the semiconductor via coupling with a support substrate, such as in a WLCSP arrangement. The ability to absorb these internal forces increases reliability of the semiconductor device because it is less likely that these forces will lead to cracking or separation of the semiconductor device from the substrate.

The semiconductor devices described in the present disclosure also include multiple channels, where each of the channels are transverse with respect to each other. In some examples, a few of the channels extend all the way through the semiconductor device while others extend only partially through the semiconductor device. In yet other examples, all of the channels extend all the way through the semiconductor device or all of the channels extend only partially through the semiconductor device.

The channels are formed between different semiconductor structures within the semiconductor device. For example, a channel may be formed between two different semiconductor die that are part of the semiconductor device. Each of the die may perform similar or different functions. Alternatively, a channel may be formed between adjacent sections or portions of the same semiconductor device. Again, the channel separates the different sections or portions, which may perform similar or different functions.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

The present disclosure is generally directed to devices having channels between active portions of the device, with an elastic material, such as a polymer, in the channels to increase the thermal and mechanical performance of the device. In an embodiment, the channels extend all the way through a semiconductor substrate of the device, while in other embodiments, the channels extend only partially through the semiconductor substrate. In yet further embodiments, multiple channels are transverse with respect to each other.

Figure 1:
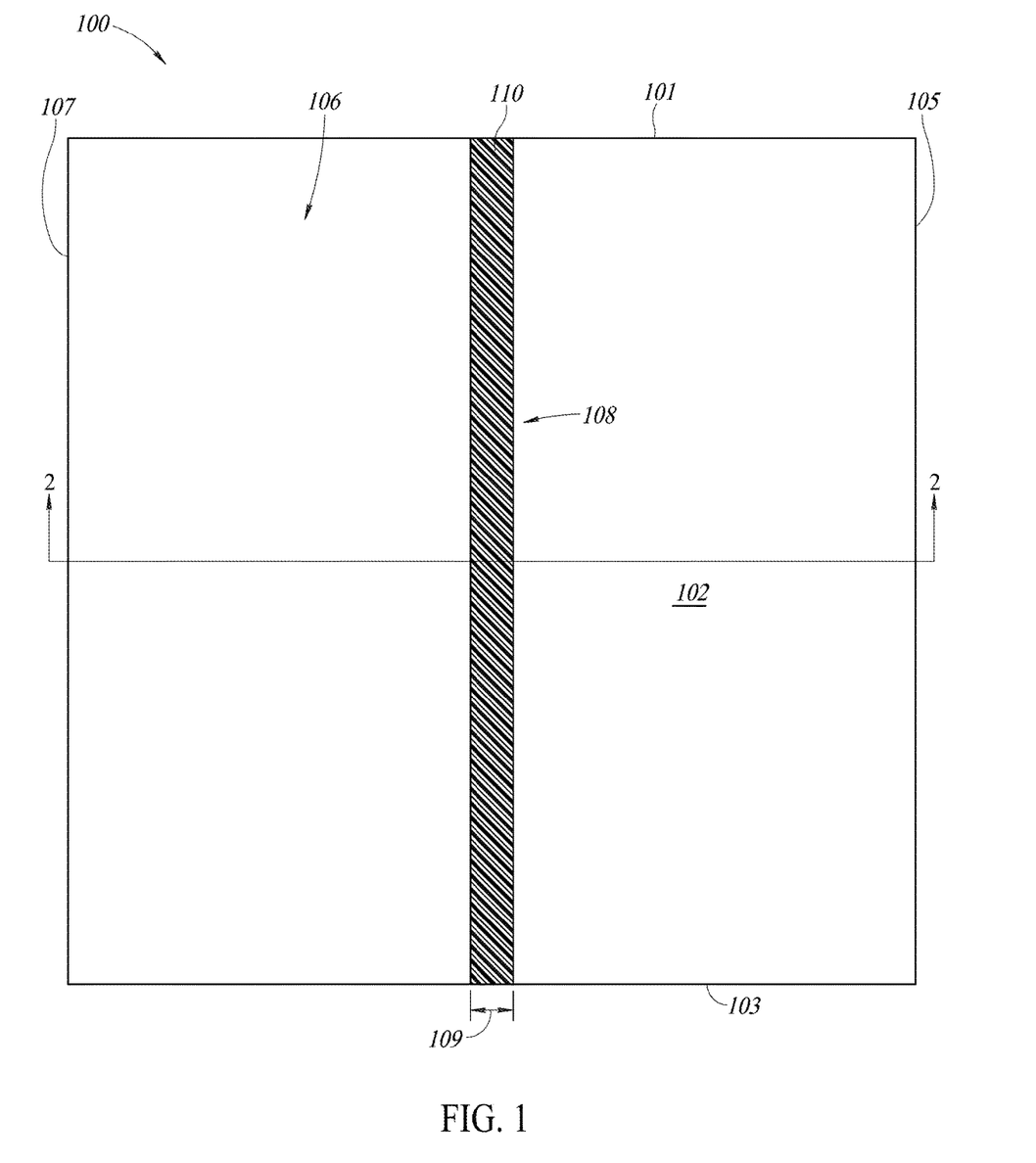
FIG. 1 is a plan view of an exemplary embodiment of a device having a channel filled with polymer extending through a semiconductor substrate of the device according to the present disclosure.
Figure 2:
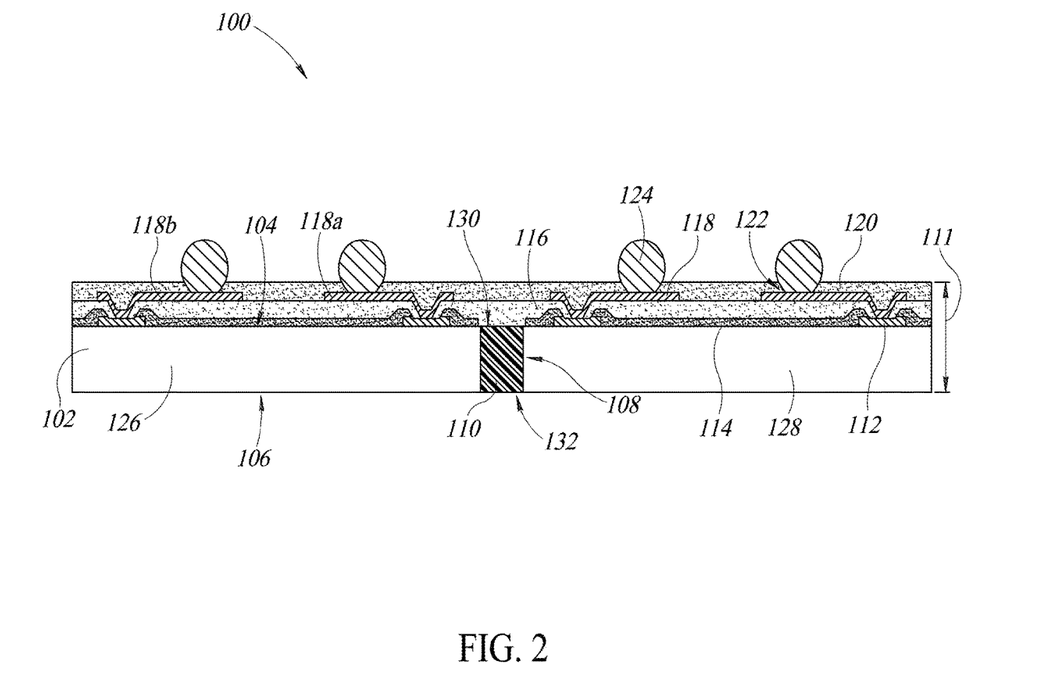
FIG. 2 is a cross-sectional view of the device of FIG. 1 along cut line 2-2 illustrating the channel extending through the semiconductor substrate from a first surface to a second surface.

The polymer increases the coefficient of thermal expansion of the semiconductor device so that it more closely matches that of a support substrate, such as a printed circuit board, to which the semiconductor device is coupled during downstream processing. In other words, the material in the channel adds flexibility to the device, such that expansion and contraction due to the heat produced during operation are less likely to lead to cracking or separation of the connection between the device and the support substrate. This improves the reliability and useful life of the resulting combination. The increase in reliability and increased flexibility of the device enables formation of larger devices that support additional electrical connections and functionality compared to current devices of a related type, such as a WLCSP. FIGS. 1-2 illustrate an exemplary embodiment of a device 100 having semiconductor substrate 102 with a first surface 104 opposite a second surface 106. In an embodiment, the first surface 104 is an active surface and the second surface 106 is a passive or inactive surface. The active surface includes electrical connections to active and passive circuitry formed in the semiconductor substrate 102, which may include transistors, resistors, capacitors, and other circuitry suitable for the end use of the device 100.

A channel 108 extends through the substrate 102 from the first surface 104 to the second surface 106. A material 110 is formed in the channel 108. In an embodiment, the material 110 is preferably a polymer layer, which may also be referred to as a polymer. The material 110 may also be a stress buffer or a buffer or an insulator. Alternatively, the polymer 110 may be generally any elastic material, and preferably an elastic insulating material. In other embodiments, the material 110 may be a plastic material, a rubber material, a polyimide material (with or without graphite or glass fiber reinforcement), a dielectric material, or another type of insulating material preferably with elastic properties, or which has a coefficient of thermal expansion that is preferably greater than a coefficient of thermal expansion of the substrate 102. As such, while multiple different materials are suitable for the material 110, the following discussion will proceed by referencing the material 110 with respect to the preferred embodiment of a dielectric material, and more preferably, a polymer material or a polymer layer.

The substrate 102 further includes a plurality of contact pads 112 on the first surface 104 of the substrate 102. In FIG. 2, the plurality of contact pads 112 are formed on the first surface 104 and are coupled to circuitry and metal layers in the semiconductor substrate 102 (not shown). In other embodiments, the plurality of contact pads 112 may be partially recessed or formed in the first surface 104 with an outermost surface planar with the first surface 104 as described with reference to FIG. 4. In other words, the contact pads 112 can also be between the first surface 104 and the second surface 106.

A first dielectric layer 114 is formed on the first surface 104 of the substrate 102. In an embodiment, the first dielectric layer 114 is a passivation layer. The first dielectric layer 114 may be an insulator or other dielectric as is suitable for the application. In an embodiment, the first dielectric layer 114 is on a portion of each of the plurality of contact pads 112, such that a surface of each contact pad 112 is exposed for coupling to other conductive layers. A second dielectric layer 116 is on the first dielectric layer 114. In an embodiment, the second dielectric layer 116 is a polyimide layer, although the second dielectric layer 116 may also be a polymer or other insulator layer. The second dielectric layer 116 is on a portion of each of the contact pads 112. Openings in the second dielectric layer 116 are formed to re-expose the surface of the contact pads 112.

A conductive layer or redistribution layer 118 is on the second dielectric layer 116. More specifically, the redistribution layer 118 may include multiple portions, such as portions 118a, 118b formed on various locations of the second dielectric layer 116. The redistribution layer 118 is coupled to the plurality of contact pads 112. In an embodiment, each of the portions 118a, 118b of the redistribution layer 118 is in abutting physical contact with at least one contact pad 112. The redistribution layer 118 may be one of several different conductive materials, such as metals and metal alloys. As such, the redistribution layer 118 is electrically coupled to the contact pads 112.

A third dielectric layer 120 is on the second dielectric layer 116 and the redistribution layer 118. In an embodiment, the third dielectric layer 120 is a polyimide layer, while in other embodiments, the third dielectric layer 120 is a polymer or other insulator layer. The third dielectric layer 120 may be the same material as the second dielectric layer 116, or a different material. The third dielectric layer 120 includes recesses or openings 122 formed by masking, laser cutting, or etching, to expose portions of the redistribution layer 118. A solder ball 124 is electrically and physically coupled to the exposed portions of the redistribution layer 118 through the recesses 122.

As illustrated, the device 100 includes a plurality of solder balls 124, wherein each solder ball is coupled to a respective portion 118a, 118b of the redistribution layer 118 and thus, each of the solder balls 124 are electrically coupled to ones of the contact pads 112 through the redistribution layer 118. Although FIG. 2 shows one solder ball 124 per portion 118a, 118*b* of the redistribution layer 118, it is to be appreciated that multiple solder balls 124 can be coupled to a single portion 118*a*, 118*b* of the redistribution layer 118, as the redistribution layer may extend (e.g., in a direction into and out of the page in the illustrated orientation) across the first surface 104 in order to establish a connection between multiple contact pads 112. In other embodiments, there may be additional layers of conductive materials and dielectric layers to create the electrical connections between contacts 112 on the semiconductor substrate 102 and the solder balls 124.

In an embodiment, the substrate 102 is a single silicon die, wherein the silicon die includes a first logic block 126 and a second logic block 128 separated from the first logic block 126 by the first channel 108 and the polymer layer 110. The first logic block 126 and the second logic block 128 may have the same, or different functions, depending on the circuitry in one or more layers of the substrate 102. For example, the first die 126 may be a memory, and the second die 128 may be a processor, although other combinations are expressly contemplated herein. The first and second blocks 126, 128 in this embodiment are physically and electrically separated by a space formed by the channel 108. The first and second blocks 126, 128 may be electrically coupled to exchange signals in use through the redistribution layer 118 and conductive layers as appropriate.

In other embodiments, the substrate 102 includes a first die 126 and a second die 128, with the first channel 108 and the polymer layer 110 extending through the substrate 102 between the first die 126 and the second die 128 to separate the first die 126 and the second die 128. The first die 126 and the second die 128 may have the same, or different functions, and may be electrically coupled to exchange signals, as described above. In an alternative embodiment, the substrate 102 includes a first portion or section 126 and a second portion or section 128 separated by the channel 108, which may perform the same, or different functions.

As shown more clearly in FIG. 1, the device 100 includes the second surface 106 being generally flat and planar and having the polymer layer 110 exposed in a location corresponding to the location of the channel 108 in FIG. 2. In an embodiment, the polymer layer 110 includes a first outermost surface 130 opposite a second outermost surface 132 (see FIG. 2), wherein the first outermost surface 130 is coplanar or flush with the first surface 104 of the substrate 102 and the second outermost surface 132 is coplanar or flush with the second surface 106 of the substrate 102. Further, the substrate 102 includes a first outermost peripheral edge 101 opposite a second outermost peripheral edge 103 and a third outermost peripheral edge 105 opposite a fourth outermost peripheral edge 107 to define a perimeter of the substrate. As illustrated, the substrate 102 is generally square, although other shapes of substrate are contemplated herein, including rectangular. In FIG. 1, the channel 108 extends between the first and second outermost peripheral edges 101, 103. In other words, the channel 108 extends across the entire planar surface of the substrate 102. However, in other embodiments, the channel 108 does not extend between the edges 101, 103, but rather, the ends of the channel terminate before the edges 101, 103, such that a portion of the substrate 102 is between the ends of the channel 108 and the outermost peripheral edges 101, 103, as described with reference to FIG. 3.

A thickness 109 of the channel 108 is preferably between 20 micrometers and 100 micrometers, although the thickness 109 may be more or less than 20 micrometers and more or less than 100 micrometers in other embodiments. The thickness 109 is a space formed between the first block 126 and the second block 128, such that the first block is spaced from the second block 128 by a dimension that corresponds to the thickness. In addition, a thickness 111 of the device 100 that extends between the surface 106 and an outermost surface of the third dielectric layer 120 is preferably between 150 micrometers and 400 micrometers, or more or less. In a preferred embodiment, the thickness 111 of the device is between 180 micrometers and 220 micrometers.

Figure 3:
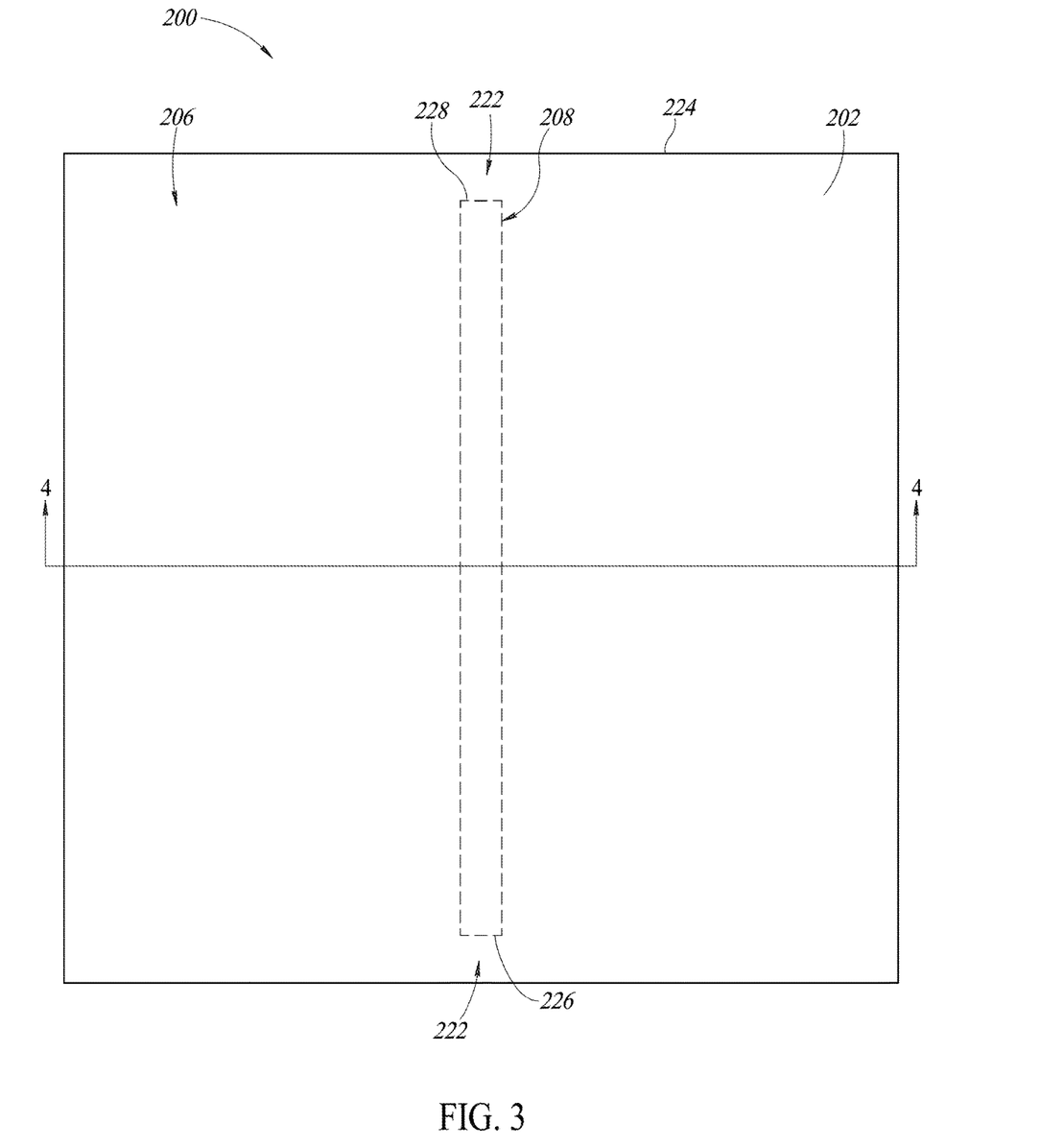
FIG. 3 is a plan view of an alternative exemplary embodiment of a device with a channel extending partially through the semiconductor substrate according to the present disclosure.
Figure 4:
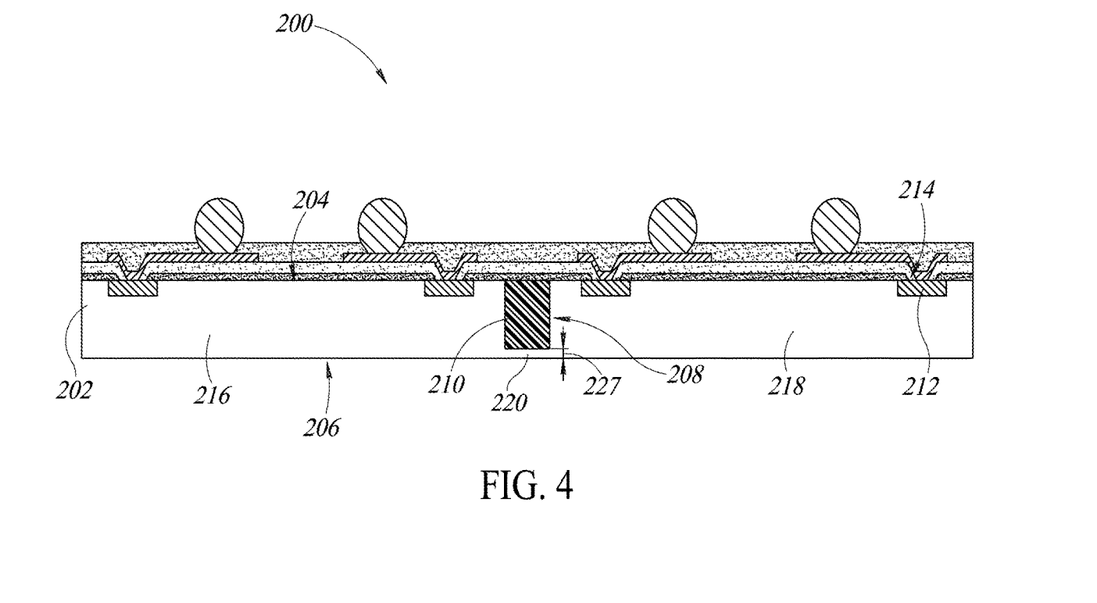
FIG. 4 is a cross-sectional view of the device of FIG. 3 along cut line 4-4 illustrating the channel extending partially through the semiconductor substrate and polymer in the channel.

FIGS. 3-4 illustrate an alternative exemplary embodiment of a device 200, which may include some, or all, of the features described above with respect to the device 100 in FIGS. 1-2. As such, description of repetitive features and their functions may be omitted solely in the interest of brevity and to avoid obscuring the features of the described embodiments, but it is to be appreciated that device 200 includes such features even if not explicitly described with reference to FIGS. 3-4.

The device 200 includes a semiconductor substrate 202 having a first surface 204 opposite a second surface 206 and a channel or recess 208 extending at least partially through the substrate 202 from the first surface 204 towards the second surface 206. In an embodiment, the first surface 204 is an active surface and the second surface 206 is an inactive or passive surface, which may be thinned as suitable for the end use of the device. A buffer material 210, which may be a dielectric, a polymer, or a polymer layer, fills the channel 208.

The substrate 202 further includes contact pads 212 in the first, active surface 204 of the substrate (e.g., between the first surface 204 and the second surface 206). The contact pad 212 has a surface 214, which may be an outermost surface or a surface proximate the first surface 204 of the substrate that is coplanar or flush with the first surface 204. Alternatively, the contact pad 212 may be on the first surface 204, similar to FIG. 2. FIG. 4 illustrates a plurality of contact pads 212, wherein each contact pad 212 may be in the first surface 204, as above. Alternatively, one or more of the plurality of contact pads 212 may be on the first surface 204, while others are in the first surface 204.

The device 200 differs from the device 100 (see FIG. 1) in that the channel 208 does not extend all the way through the substrate 202. Rather, the channel 208 extends partially through the substrate 202 and is spaced from the second surface 206 by a distance 227. As such, the substrate 202 includes a first portion 216, a second portion 218, and a third portion 220. Each of the portions 216, 218, 220 may also be referred to as sections. The portions 216, 218, 220 define sidewalls of the channel 208, as illustrated. In an embodiment, a thickness of the first portion 216 and a thickness of the second portion 218 are equal or substantially equal (e.g. each having a thickness within 5% of the other thickness) whereas a thickness of the third portion is preferably equal to or less than 50 micrometers (e.g., the distance 227 may be equal to or less than 50 micrometers). Because the channel 208 can be formed by laser cutting, etching, or other processes, the depth of the channel 208 can vary according to specifications of an application for the device 200. As such, the thickness of the third portion 220 can be more or less than 50 micrometers in other embodiments, such as between 10 and 40 micrometers, for example. As with the device 100, the substrate 202 can be a single silicon die with the first portion 216 being a first logic block and the second portion 218 being a second logic block with the channel 208 and the buffer 210 being between the logic blocks. Typically, the third portion 220 will not include any critical circuitry, i.e. will not include electrical connections. Any electrical connections between the logic blocks or portions 216, 218 will be along the first, active surface 204.

As shown more clearly in FIG. 3, the second surface 206 of the substrate 202 is generally flat and planar and does not include exposed buffer material 210 because the channel 208, shown in dashed lines corresponding to a location of the channel 208 in FIG. 4, preferably does not extend all the way through the substrate 202. Further, the channel 208 preferably does not extend to an outermost edge 224 of the substrate 202, but rather, there is a portion 222 of substrate 202 between ends or outermost edges 226, 228 of the channel 208 and the outermost edge 224 of the substrate 202. The portion 222 is spaced a distance 225 from the edge 224 to the outermost edge 226 of the channel 208.

In an embodiment similar to that described with reference to FIGS. 1-2, the channel 208 extends through the substrate 202, but preferably does not extend to the outermost edge 224 of the substrate 202. Rather, the channel 208 terminates prior to the outermost edge 224 of the substrate 202, such that the portion 222 of substrate 202 is present between ends of the channel 208 and the outermost edge 224 of the substrate. In yet a further embodiment, the channel 208 extends through at least a portion of the substrate 202 from the first surface 204 to the second surface 206 and at least partially extends, but not all the way, through the substrate 202 in a second, different portion of the substrate 202.

As illustrated in FIGS. 1-4, an embodiment of the channels described herein are linear and in a substantially parallel arrangement to at least one outermost edge of the substrate. Moreover, it is to be appreciated that while FIGS. 1-4 illustrate the various channels being equidistant from the outermost edges of the substrate, the channels can be spaced anywhere along the substrate in a lateral direction (e.g. left to right in the orientation shown in FIG. 1). As such, the channels can be closer to one edge than the other in the transverse direction. Moreover, in embodiments where the channels preferably do not extend to the outermost edge in a transverse direction (e.g., up and down in the orientation shown in FIG. 1), such as in FIG. 3, it is to be understood that the channels can be closer to the outermost edge on one side than the other. As such, the portions of substrate between ends of the channel may be different with respect to each end, and more specifically, more or less at one end than the other. In other embodiments, one or more channels are at any transverse angle with respect to the outermost edge of the substrate as opposed to being parallel. While the sidewalls of each channel are preferably flat and planar and configured to be at 90 degree angles with respect to each other, it is to be further appreciated that etching or other formation processes can be used to form channels with sidewalls that are at transverse angles with respect to other, or that include one or more rounded or curved surfaces, such as in a chamfered configuration.

FIGS. 5-9 illustrate respective alternative exemplary embodiments of a device according to the present disclosure. Each of FIGS. 5-9 illustrate a second, passive surface of the respective embodiment of the device. It is to be appreciated that each of the first, active surfaces of the respective embodiments of the semiconductor devices described with reference to FIGS. 5-9 may include the features of the first surface 104, 204 described above with reference to FIGS. 1-4. For example, in an embodiment, the first surface of each device described with reference to FIGS. 5-9 may include a passivation layer on the first surface, contacts on or in the first surface, a first polyimide layer on the first passivation layer, a redistribution layer on the first polyimide layer and coupled to the contacts, a second polyimide layer on the first polyimide layer and the redistribution layer, and solder balls coupled to the redistribution layer through openings in the second polyimide layer. As such, additional details regarding the first surface of each embodiment in FIGS. 5-9 will not be repeated solely in the interest of brevity and to avoid obscuring features of the respective embodiments.

Figure 5:
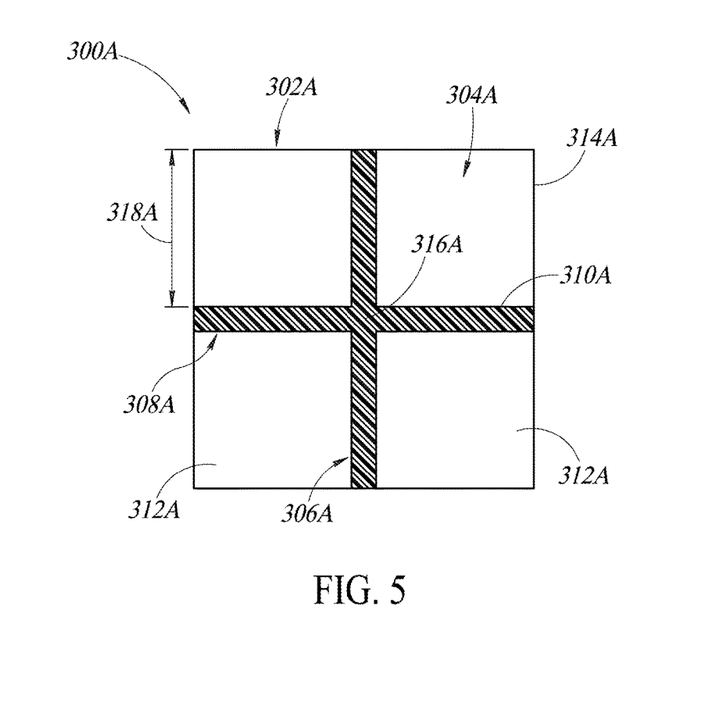
FIGS. 5-9 are plan views of alternative exemplary embodiments of a device with multiple channels transverse to each other according to the present disclosure.

FIG. 5 illustrates a device 300A having a substrate 302A with a passive surface 304A opposite an active surface (not shown). The substrate 302A includes a dielectric buffer 310A having a plus shape. A first channel region 306A and a second channel region 308A extend through the substrate 302A from the first surface to the second surface 304A to form part of the plus shape. The first channel region 306A is transverse and overlaps the second channel region 308A at a central region 316A the substrate. The dielectric buffer 310A, which may be a polymer, fills each of the channel regions 306A, 308A.

In an embodiment, the substrate 302A is a single silicon die including a plurality of logic blocks or sections 312A of the die that are formed with spaces to accommodate the formation of the channels regions 306A, 308A. Each logic block 312A is separated from corresponding adjacent ones of the plurality of logic blocks 312A by the first channel region 306A and the second channel region 308A. In other embodiments, the substrate 302A includes a plurality of die 312A instead of logic blocks of a single die. In such embodiments, each of the plurality of die 312A are separated from corresponding adjacent ones of the plurality of die 312A by the first channel region 306A and the second channel region 308A. As shown in FIG. 5, the channel regions 306A, 308A intersect at 90 degree angles or substantially 90 degree angles with respect to each other at the center region 316A of the device 300A relative to an outermost edge 314A of the substrate 302A. As such, the channels 306A, 308A are spaced equidistant from the outermost edge 314A and perpendicular with respect to each other.

Each of the sections or portions 312A, which may be individual die or logic blocks of the same die, as above, may be about 4 millimeters ("mm") by 4 mm in size. In other words, a length 318A of each side of each section 312A may be 4 mm or approximately 4 mm, wherein in this embodiment, the length of each side of each section is equal, such that each section 312A is preferably square in shape when viewed from a plan view, as shown. An overall size of the device 300A may be 10 mm by 10 mm, with the sections 312A comprising 8 mm and the channels comprising 2 mm of the total 10 mm size. In other embodiments, the thickness of the channel regions 306A, 308A (e.g. a distance between sidewalls of the channel regions 306A, 308A defined by the plurality of logic blocks 312A) is more or less than 2 mm, as described above with reference to FIGS. 1-4, and the size of each section 312A is more or less than 4 mm. The dimensions of the sections 312A may also each be different, such that each section has a different size relative to the other sections 312A. In other embodiments, two or more are the same size, while others are different sizes.

Figure 6:
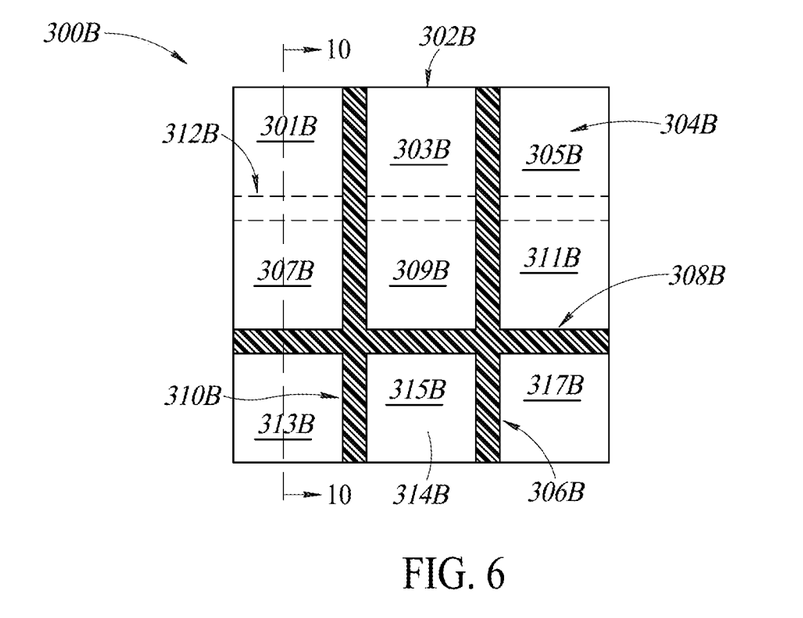

FIG. 6 illustrates a device 300B, which may include some of the features described above with reference to FIG. 5. The device 300B includes a semiconductor substrate 302B. The semiconductor substrate 302B includes a plurality of distinct sections 301B, 303B, 305B, 307B, 309B, 311B, 313B, 315B, 317B. The substrate 302B includes a first dielectric region 306B that extends along a first direction and is spaced from a first center line of the device that extends along the first direction. A second dielectric region 308B extends along a second direction that is transverse to the first direction and is spaced from a second center line that extends along the second direction. A third dielectric region 310B extends along the first direction and is spaced from the first dielectric region 306B. The device 300B further includes a fourth dielectric region 312B that extends along the second direction and is spaced from the second dielectric region 308B.

The first, second, and third dielectric regions 306B, 308B, 310B extend all of the way through the substrate 302B. The fourth dielectric region 312B extends only partially through the substrate 302B, as indicated by dashed lines. A polymer layer 314B is in each of the dielectric regions 306B, 308B, 310B, 312B. Further, each of the dielectric regions 306B, 308B, 310B, 312B are intersecting and transverse to each other and spaced equidistant relative to the substrate 302B. As such, there are nine portions or sections 314B in the device 300B, which may perform the same, or different functions. Moreover, each of the portions sections 314B may be logic blocks of a single silicon die, or different die of the device 300B.

Figure 7:
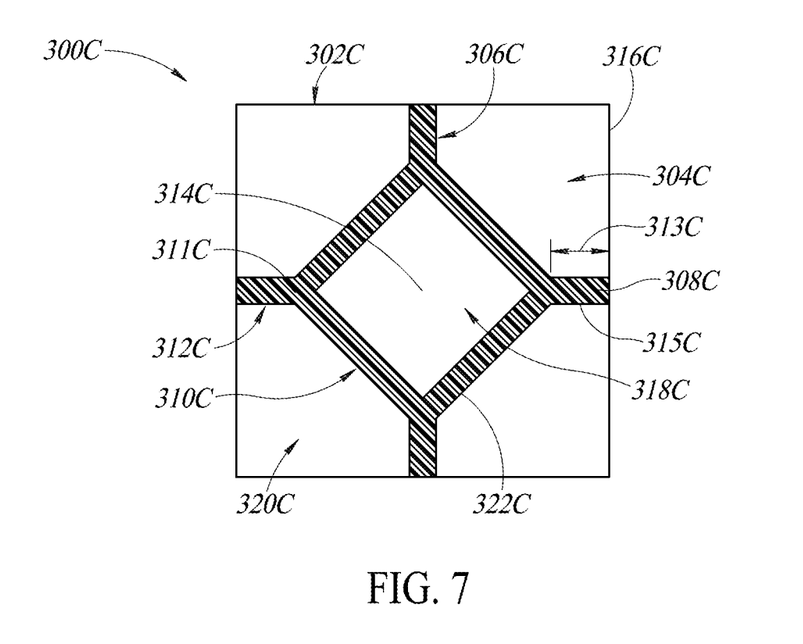

FIG. 7 illustrates a device 300C, which may include some of the features described above with reference to FIGS. 5-6. The device 300C includes a substrate 302C with a second surface 304C opposite a first surface. The substrate 302B includes a channel 306C extending from the first surface to the second surface 304C. A polymer layer 308C is in the channel 306C. As shown in FIG. 7, the channel 306C has a diamond or square shape such that sides of the diamond are not parallel with the sides of the substrate 302C. The sides of the diamond are shifted or rotated with respect to the sides of the substrate 302C. In some embodiments, a diagonal line from the corners of the substrate 302C will be transverse to one or more sides of the diamond.

The channels described are not limited to only linear channels, but rather, include other geometric shapes, including curved shapes. Moreover, the channel 306C includes a first portion 310C arranged around a center 314C of the device 300C connected to second portions 312C extending from the first portion 310C to an outermost edge 316C of the device 300C. The device 300C further includes a first portion or section 318C that is square in shape and arranged as a diamond as well as several adjacent second portions or sections 320C that have a trapezoidal shape. As such, while some of the sides of the second portions 320C are perpendicular relative to each other, others, such as side 322C are transverse to the remaining sides. In other words, side 322C is at an angle with respect to the remaining sides that is not 0 degrees and not 90 degrees.

In one embodiment, corners 311C of the diamond may be spaced from the sides of the die. More particularly, extensions 315C that extend a distance 313C from the corner 311C to the side of the die may be omitted.

Figure 8:
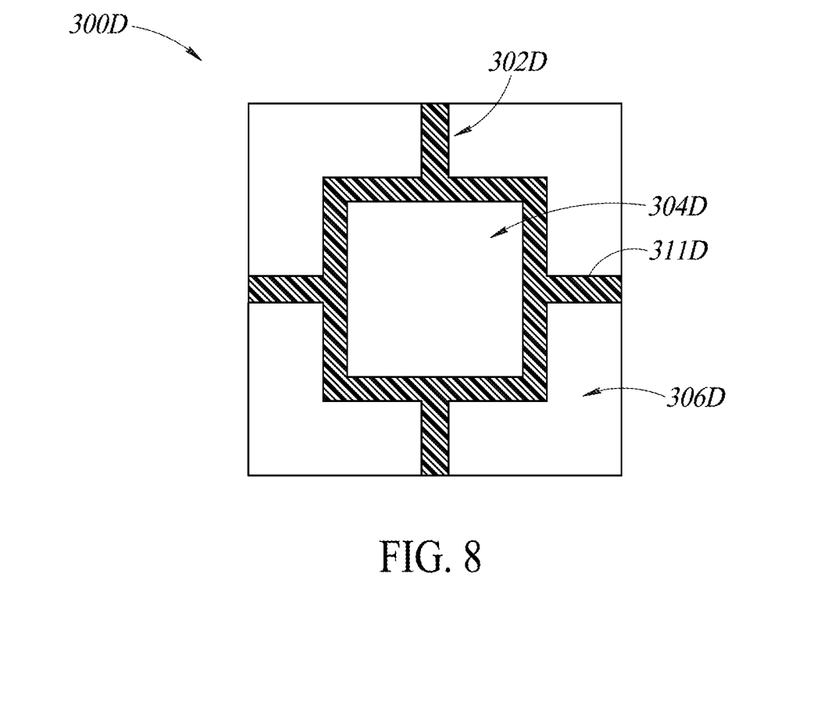

Other shapes and configurations of semiconductor devices are contemplated in the present disclosure. For example, FIG. 8 illustrates an alternative embodiment of a semiconductor device 300D with a square channel 302D and extensions 311D from a center region of a side of the square channel to a side of the device 300D. The extensions 311D extend towards central regions of the sides of the device 300D to provide flexibility to the device 300D. As such, the semiconductor device 300D has a first, central portion 304D that is square in shape and second portions 306D that are rectilinear or L-shaped. The center region 304D may include the most critical aspects of the die, those that are most susceptible to stress and damage. The second, outer portions 306D may include less critical circuitry that are less responsive to stress and damage.

Figure 9:
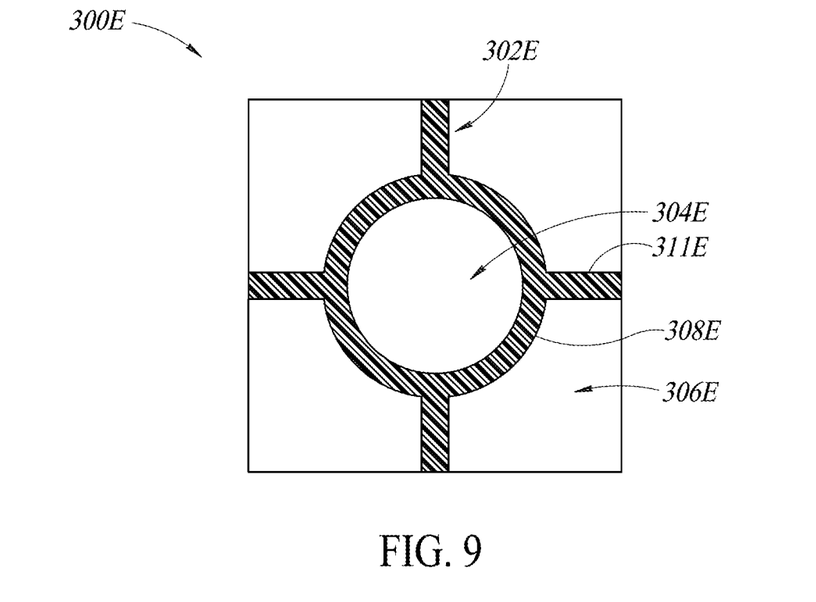

FIG. 9 illustrates an alternative embodiment of a semiconductor device 300E with a circular channel 302E and linear extensions 311E that extend towards a central region of the sides of the die. Four extensions are illustrated, however, two could be included, such as those that are aligned along a center line. As such, the semiconductor device 300E includes a first portion or section 304D that is circular and second portions 306D adjacent and surrounding the first portion 304D on the other side of the channel 302E that are generally square with one rounded edge 308D. As such, the present disclosure is not limited by the shape of the channel and the portions of the semiconductor device adjacent the channel, but rather, a number of different geometric, rectilinear, and curved shapes of channels are contemplated.

Figure 10:
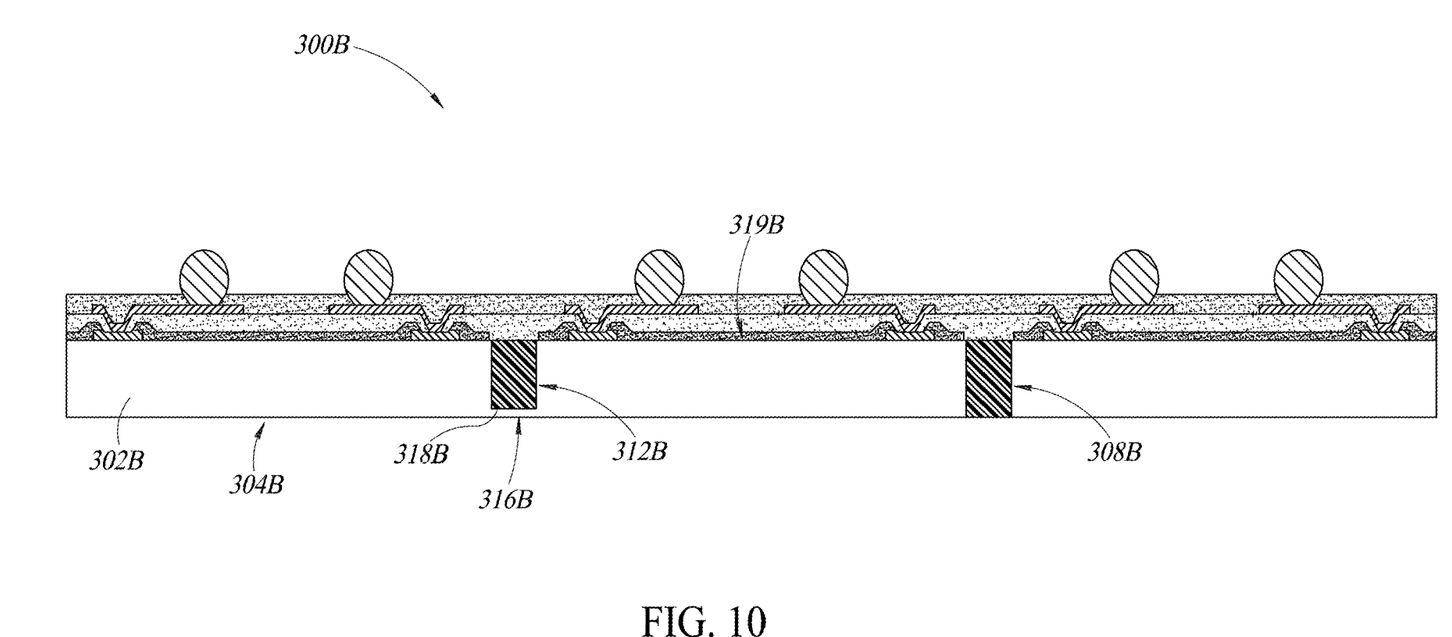
FIG. 10 is a cross-sectional view of the device of FIG. 6 along cut line 10-10 illustrating a first channel extending partially through the semiconductor substrate and a second channel extending through the semiconductor substrate.

FIG. 10 is a cross-sectional view of the semiconductor device 300B shown in FIG. 6 along cross section line 10-10. As described herein, the semiconductor device 300B includes the first dielectric region 308B and the fourth dielectric region 312B. The first dielectric region 308B extends all of the way through the substrate 302B from a first surface 319B to the second surface 304B of the substrate 302B. The fourth dielectric region 312B preferably extends partially through the substrate 302B. In other words, the fourth dielectric region 312B preferably extends into the first surface 3196 of the substrate 302B, but preferably does not extend all the way through the substrate 302B from the first surface 319B to the second surface 304B. Rather, a portion 316B of the substrate 302B remains between an edge 318B of the fourth dielectric region 312B and the second surface 304B of the substrate 302B. In an embodiment, a thickness of the portion 316B (e.g., a dimension between the edge 318B of the fourth channel 312B and the second surface 304B) is between 10 and 30 micrometers. In other embodiments, the thickness is less than 10 micrometers or more than 30 micrometers. In yet a further embodiment, the thickness is preferably less than 50 micrometers. As such, a single semiconductor device, such as semiconductor device 300B, can have at least one channel or dielectric region that extends all of the way through the substrate and at least one channel or dielectric region that preferably extends partially through the substrate, but preferably not all the way through the substrate.

Figure 11:
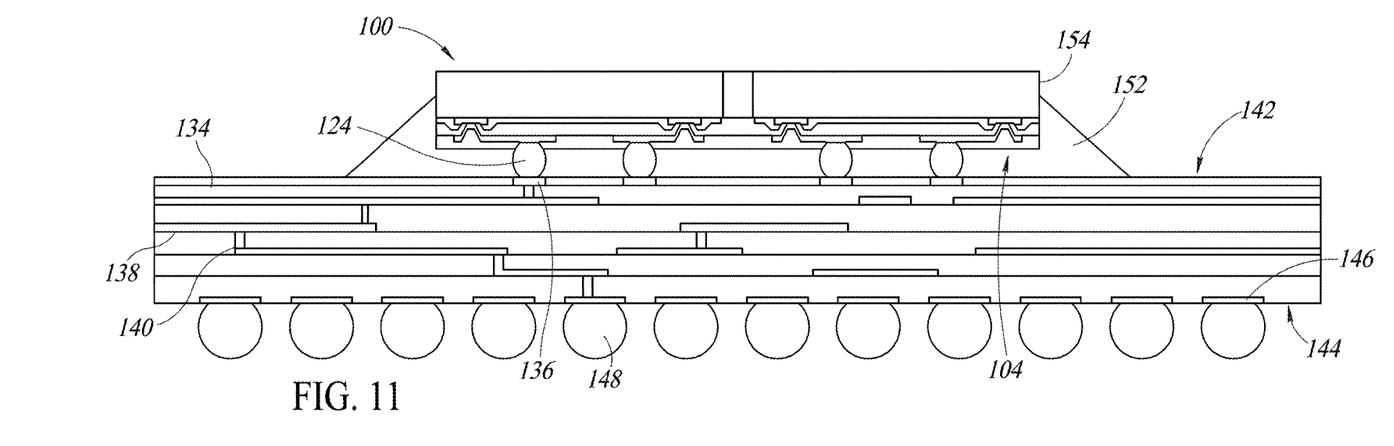
FIG. 11 is a cross-sectional view of the device of FIG. 2 coupled to an exemplary embodiment of a support substrate.
Figure 12:
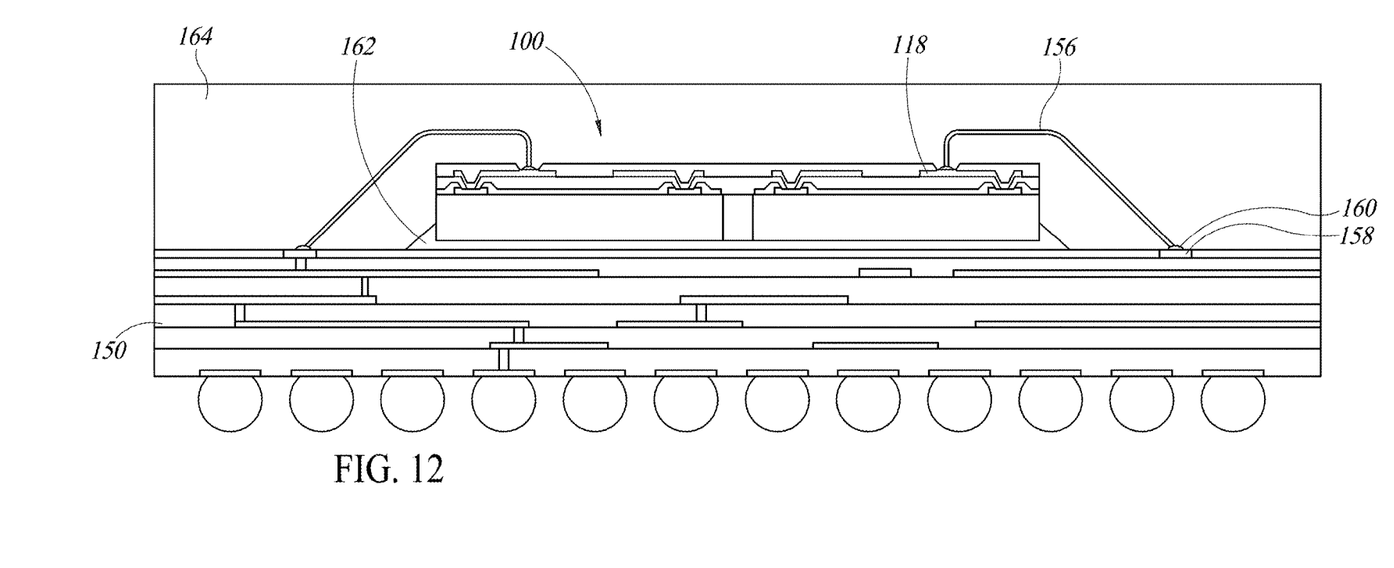
FIG. 12 is a cross-sectional view of a similar device of FIG. 2 coupled to an alternative exemplary embodiment of a support substrate.

FIGS. 11-12 illustrate the semiconductor device 100 from FIG. 2 coupled to various support substrates. It is noted that various devices from this disclosure can be coupled in a similar manner as described with respect to FIGS. 11 and 12. FIG. 11 illustrates the semiconductor device 100 coupled to a substrate 134, such as a printed circuit board ("PCB") or a flip chip PCB. In an alternative embodiment, the substrate 134 is a ball grid array ("BGA"), such as a flip chip BGA, wherein the substrate 134 is later coupled to a PCB in further processing. The substrate 134 includes a first major surface 142 opposite a second major surface 144. Preferably, the semiconductor device 100 is coupled to the first major surface 142. The solder balls 124 of the semiconductor device 100 are coupled to contacts 136 in the substrate 134. In an alternative embodiment, the contacts 136 are on the substrate 134, similar to the contacts 112 in FIG. 2. As understood, the substrate 134 preferably comprises multiple layers of dielectric and conductive materials. Each layer may include a number of electrical connections, conductive lines or traces 138. The traces 138 are coupled to each other through dielectric layers with vias or connections 140 that extend between adjacent layers.

The semiconductor device 100 is electrically connected to solder balls 148 coupled to contacts 146 on or in the second major surface 144 of the substrate 134. As such, an electrical connection between the semiconductor device 100 and an external device to which the substrate 134 is coupled can be established through an electrical that includes the solder balls 124 of the semiconductor device 100, contacts 136 in or on the first surface of the substrate 134, traces 138 and vias 140 of the substrate 134, and solder balls 148 connected to contacts 146 in or on the second surface 144 of the substrate. The solder balls 148 of the substrate 134 are electrically coupled to the external device. The electrical connection between the semiconductor device 100 and the substrate 134 may further be protected by an underfill material 152 formed between and surrounding the second surface 106 of the semiconductor device 100 and the first surface 142 of the substrate 134, including solder balls 124 of the semiconductor device 100 and contacts 136 of the substrate 134. In an embodiment, the underfill 154 extends along sidewalls 154 of the semiconductor device 100. Moreover, the underfill 154 aids in physically connecting the semiconductor device 100 to the substrate 134. The underfill 152 may be a molding compound or other dielectric material.

FIG. 12 illustrates the semiconductor device 100 coupled to an alternative embodiment of a substrate 150, such as a PCB, wherein instead of solder balls, wires 156 are electrically coupled between the redistribution layer 118 of the semiconductor device 100 and contacts 158 on or in the substrate 150. In an embodiment, the wires 156 are various types of metal and are soldered to the redistribution layer and the contacts 158 of the substrate, such that some solder 160 remains on the contacts 158 and the redistribution layer 118. In an alternative embodiment, the wires 156 are ink printed wires, wherein an electronically conductive paste with entrained metal is deposited over a layer between the semiconductor device 100 and the substrate 150. The ink printed wires are sintered or cured, which removes the layer and hardens the wires 156. The semiconductor device 100 is coupled to the substrate 150 with a die attach material 162, which may be any known die attach material. Then, the resulting combination is encapsulated in molding compound 164. As with the embodiment described with reference to FIG. 11, an electrical connection is established from the semiconductor device 100 through the substrate 150, such that the semiconductor device 100 can be electrically connected to an external device.

FIGS. 13A-H illustrate a process flow of an exemplary embodiment of a method according to the present disclosure for forming the semiconductor devices described herein. The method begins in FIG. 13A with a substrate 402, which may be semiconductor wafer, for example, that has a first surface 404 opposite a second surface 406, wherein the first surface 404 may be an active surface and the second surface 406 may a passive or inactive surface, as described herein. A plurality of contact pads 408 are formed on the first surface 404, or in the first surface 404, as described herein. Then, a passivation layer 410, which may be in contact with at least a portion of each contact 408 is formed on the first surface 404 after the contacts 408. In an embodiment, the method begins with a bare substrate 402, and the contact pads 408 and the passivation layer 410 are formed according to known processes. In an alternative embodiment, the method begins with the substrate 402 having pre-formed contacts 408 and a pre-formed passivation layer 410.

Figure 13A:
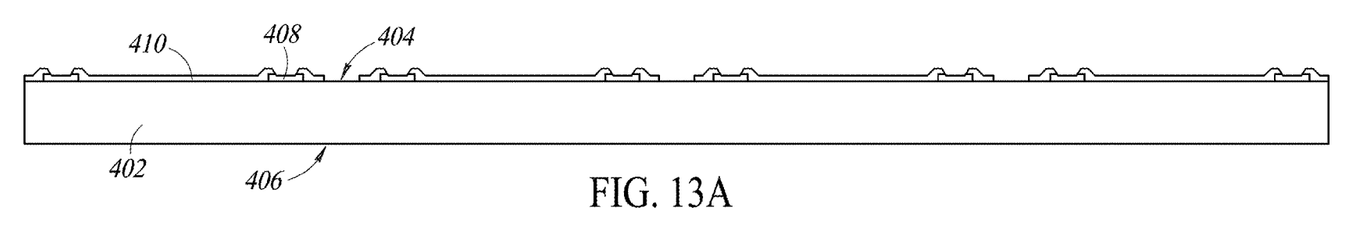
FIGS. 13A-H are cross-sectional views of an exemplary embodiment of a process flow for forming a device according to the present disclosure.
Figure 13B:
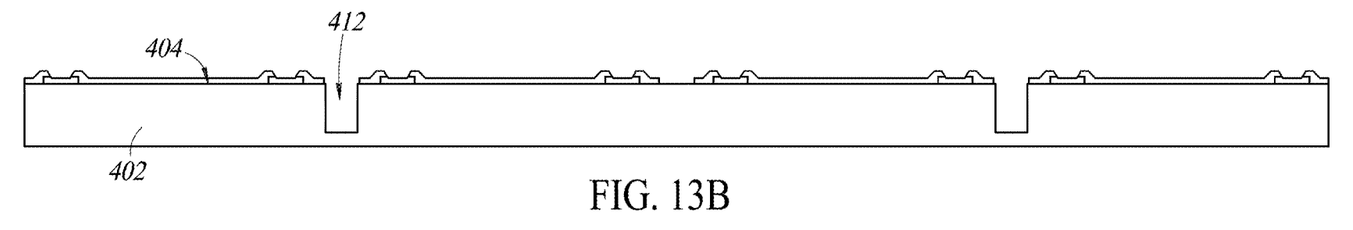

In FIG. 13B, a plurality of channels 412 are formed in the first surface 404 of the substrate 402. The channels 412 can be formed by laser cutting, plasma cutting, mechanical cutting, or etching, among other processes, in alternative embodiments. While only cross-sectional views are described with reference to FIGS. 13A-H, it is to be appreciated that forming the channels 412 can include forming a plurality of channels with any shape and orientation, such as those illustrated in FIGS. 5-9, wherein each channel is transverse to the other channels. The channels 412 preferably do not extend through the substrate 402. Further, a depth 401 of each channel 412 may vary in different embodiments, such as when it is preferred that the channels do not extend through the substrate 402, in which case, the channels 412 are formed to a shallower depth than in embodiments where the channels 412 preferably extend through the substrate 402. The depth of the channels 412 may also vary across the substrate 402, such that first ones of the channels 412 are formed to a first depth, while others are formed to a second, different depth, such as when forming the semiconductor device 300B shown in FIG. 10 wherein at least one channel 412 preferably extends through the substrate 402 and at least one channel preferably extends only partially through the substrate 402.

Figure 13C:
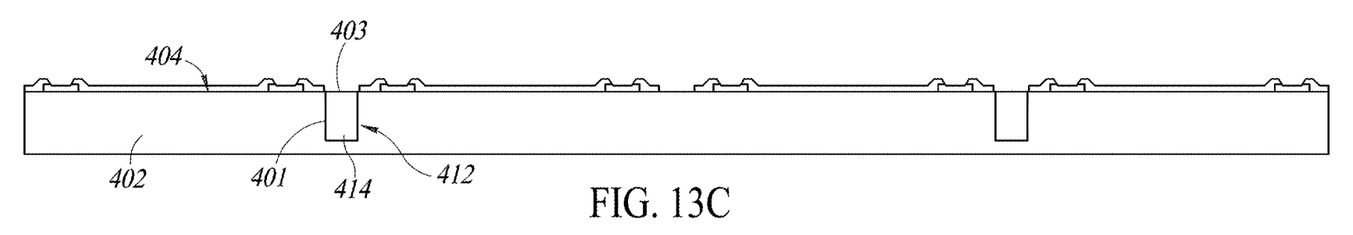
Figure 13D:
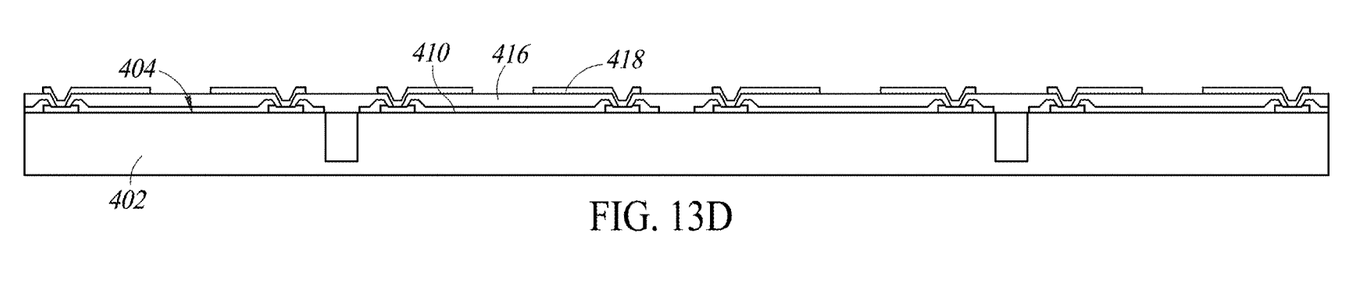

In FIG. 13C, polymer 414 is deposited in each of the channels 412 and cured. The polymer 414 preferably has a first or outer surface 403 that is coplanar or flush with the first surface 404. In FIG. 13D, a first polyimide layer 416 is formed on the passivation layer 410 after depositing and curing the polymer 414. Then, a redistribution layer 418 is formed on the first polyimide layer 416. The redistribution layer 418 is electrically connected to each of the contact pads 408.

Figure 13E:
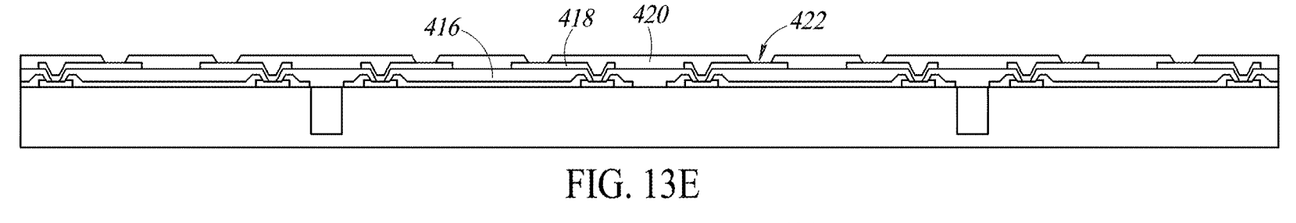
Figure 13F:
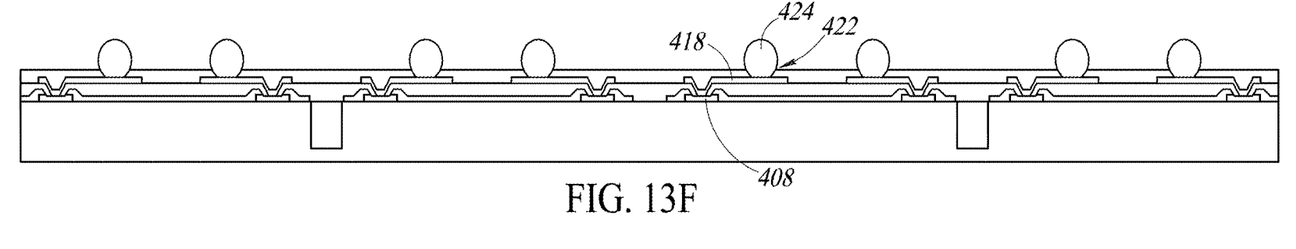

In FIG. 13E, a second polyimide layer 420 is formed on the first polyimide layer 416 and the redistribution layer 418. The forming of the second polyimide layer 420 includes leaving portions 422 of the redistribution layer 418 exposed such that solder balls 424 can be coupled to the redistribution layer 418, as in FIG. 13F, wherein the solder balls 424 are electrically coupled to the exposed portions 422 of the redistribution layer 418 and the contact pads 408 through the redistribution layer 418.

Figure 13G:
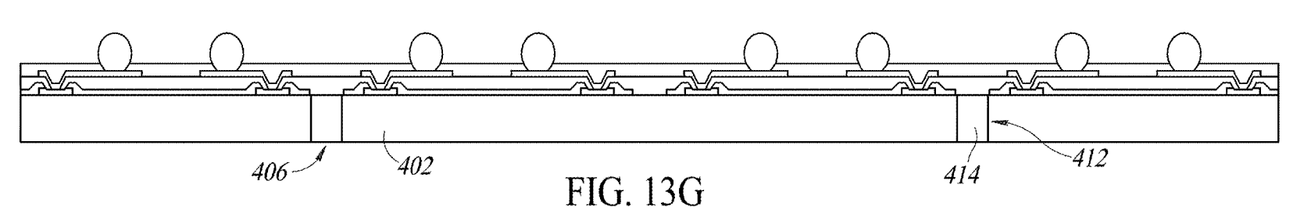
Figure 13H:
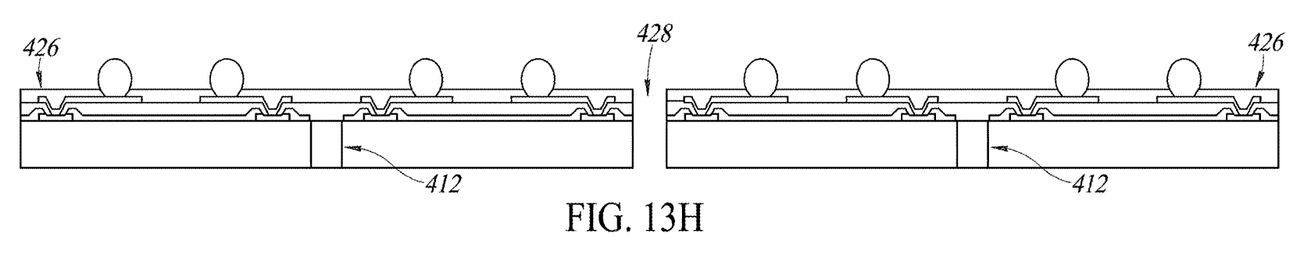

In FIG. 13G, backgrinding is performed on the second surface 406 of the substrate 402. In an embodiment, the backgrinding includes exposing the polymer 414 in the channels 412, as illustrated. In other embodiments, the backgrinding includes reducing a thickness of the substrate 402 without exposing the polymer 414 (e.g. a portion of the substrate 402 remains between the second surface 406 and the channel 412, as in FIG. 4). In yet further embodiments where the channels 412 are formed to different depths, as described with reference to FIG. 10 and FIG. 13B, the backgrinding includes exposing some of the polymer 414 in the channels 412 while in others where the channels 412 are shallower, a portion of substrate 402 remains after the backgrinding. Finally, in FIG. 13H, the substrate 402 is separated into a plurality semiconductor devices 426, wherein each semiconductor device 426 includes at least one channel 412. Separation of the substrate 402 into the semiconductor devices 426 can include separation through scoring and mechanical cutting, such as with a saw, or through laser or plasma cutting, in addition to etching.

As such, the embodiments of semiconductor devices according to the present disclosure include semiconductor devices with channels filled with an elastic material in order to increase the CTE of the semiconductor device. The elastic material may preferably be a polymer or plastic, although other materials are contemplated as well. The polymer increases the thermal and mechanical performance of the semiconductor device and reduces the CTE mismatch between the semiconductor device and a substrate to which the semiconductor device is coupled. In other words, the material in the channel adds flexibility to the semiconductor device, such that expansion and contraction due to the heat produced during operation are less likely to lead to cracking or separation of the connection between the semiconductor device and the substrate. This improves the reliability and useful life of the resulting combination. The increase in reliability and increased flexibility of the semiconductor device enable formation of larger semiconductor devices that support additional electrical connections and functionality compared to current semiconductor devices of a related type, such as a WLCSP.

In the above description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor devices, such as WLCSPs, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The relative terms "approximately" and "substantially," when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the exemplary embodiments described herein, and as such, it is expressly contemplated in the present disclosure to include dimensions that are more or less than the dimensions stated, unless the context clearly dictates otherwise.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate having a first surface opposite a second surface and a first sidewall opposite to a second sidewall, the first and second sidewalls are transverse to the first and second surfaces;
   a first channel extending through the substrate from the first surface to the second surface and extends through the substrate from the first sidewall to the second sidewall;
   an elastic polymer in the first channel, the elastic polymer being substantially coplanar with the first surface of the substrate and exposed at the second surface of the substrate and the elastic polymer being coplanar with the first and second sidewalls and exposed at the first and second sidewalls;
   a contact pad on the first surface of the substrate;
   a passivation layer on the first surface of the substrate;
   a first polyimide layer on the passivation layer; and
   a redistribution layer on the first polyimide layer, the redistribution layer electrically coupled to the contact pad.

2. The device of claim 1 further comprising:
   a second polyimide layer on the first polyimide layer and the redistribution layer.

3. The device of claim 1 wherein the substrate is a single silicon die, the silicon die including a first logic block and a second logic block separated from the first logic block by the elastic polymer layer.

4. The device of claim 1 wherein the substrate further comprises a first die and a second die, the first channel extending through the substrate between the first die and the second die.

5. The device of claim 1 further comprising:
   a second channel extending through the substrate between the first surface and the second surface, the second channel transverse to the first channel, the elastic polymer being in the second channel.

6. The device of claim 5 wherein the substrate is a single silicon die, the silicon die including a plurality of logic blocks, each logic block of the plurality of logic blocks separated from corresponding adjacent ones of the plurality of logic blocks by the first channel and the second channel.

7. The device of claim 5 wherein the substrate further comprises a plurality of die, each die of the plurality of die separated from corresponding adjacent ones of the plurality of die by the first channel and the second channel.

8. The device of claim 1 wherein the elastic polymer includes a first outermost surface opposite a second outermost surface, the first outermost surface and the second outermost surface of the elastic polymer being coplanar with the first surface and the second surface of the substrate, respectively.

9. A device, comprising:
   a substrate having a first surface opposite a second surface;

a channel in the first surface of the substrate extending partially through the substrate and terminating at an end within the substrate before reaching the second surface of the substrate, the substrate including a portion extending from the second surface to end of the channel;

a dielectric elastic material in the channel, an outermost surface of the dielectric being coplanar with the first surface of the substrate;

a contact pad in the first surface of the substrate;

a passivation layer on the first surface of the substrate;

a first polyimide layer on the passivation layer; and a redistribution layer on the first polyimide layer, the redistribution layer electrically coupled to the contact pad.

10. The device of claim 9 further comprising:

a second polyimide layer on the first polyimide layer and the passivation layer.

11. The device of claim 9 wherein the substrate includes a first portion, a second portion, and a third portion coupled between the first portion and the second portion, each of the first portion, second portion, and third portion defining sidewalls of the channel.

12. The device of claim 11 wherein a thickness of the third portion is less than 50 micrometers.

13. The device of claim 11 wherein the first portion is a first logic block and the second portion is a second logic block with the channel and the dielectric elastic material being between the first logic block and the second logic block.

14. A device, comprising:

a substrate having a front surface and a back surface opposite to the front surface, the substrate including a central portion and a plurality of peripheral portions spaced outward from the central portion;

central channel extending into the substrate from the front surface, the central channel surrounding the central portion of the substrate, and the central channel being between the central portion and the plurality of peripheral portions;

a plurality of extension channels extend outward from the central channel and are between adjacent ones of the plurality of peripheral portions;

an elastic insulating material in the central channel and in the plurality of extension channels, the elastic insulating material being exposed at the back surface of the substrate;

a contact pad at the front surface of the substrate;

a first dielectric layer on the front surface of the substrate and at least partially on the contact pad;

a second dielectric layer on the first dielectric layer; and a redistribution layer on the second dielectric layer, the redistribution layer electrically coupled to the contact pad.

15. The device of claim 14 wherein the elastic insulating material has a coefficient of thermal expansion that is greater than a coefficient of thermal expansion of the substrate.

16. The device of claim 14 wherein the central portion has at least one of a circular profile, a diamond profile, or a rectangular profile.

17. The device of claim 14 wherein the central channel and the plurality of extension channels extend completely through the substrate.

18. The device of claim 14 wherein:

the substrate is a single semiconductor die;

the central portion is a first logic blocks; and the plurality of peripheral portions are a plurality of second logic blocks separated from the first logic block by the elastic insulating material.

19. The device of claim 14 wherein:

the substrate includes a plurality of corners; and each respective peripheral portion of the plurality of peripheral portions is at a corresponding corner of the plurality of corners of the substrate.

20. The device of claim 19 wherein:

the substrate includes a plurality of sidewalls;

the plurality of extension channels are transverse to the central channel, each respective extension channel of the plurality of extension channels extends from the central channel to a corresponding sidewall of the plurality of sidewalls of the substrate.

\* \* \* \* \*

UNITED STATES PATENT AND TRADEMARK OFFICE
CERTIFICATE OF CORRECTION

Page 1 of 1

PATENT NO. : 11,581,232 B2
APPLICATION NO. : 16/880684
DATED : February 14, 2023
INVENTOR(S) : Jing-En Luan It is certified that error appears in the above-identified patent and that said Letters Patent is hereby corrected as shown below:

In the Claims

<u>Column 15, Line 37, Claim 14:</u>
"central channel extending" should read: --a central channel extending--.

Signed and Sealed this
Fourth Day of April, 2023

Katherine Kelly Vidal
*Director of the United States Patent and Trademark Office*